(12) United States Patent  (10) Patent No.: US 7,411,835 B2
Darrer  (45) Date of Patent: Aug. 12, 2008

(54) DISCHARGE CIRCUIT FOR A CAPACITIVE LOAD

(75) Inventor: Franz Michael Darrer, Graz (AT)

(73) Assignee: Infineon Technologies AG, Munich (DE)

( * ) Notice: Subject to any disclaimer, the term of this patent is extended or adjusted under 35 U.S.C. 154(b) by 448 days.

(21) Appl. No.: 11/153,863

(22) Filed: Jun. 15, 2005

(65) Prior Publication Data

US 2006/0001383 A1  Jan. 5, 2006

(30) Foreign Application Priority Data

Jun. 15, 2004  (DE)  .................. 10 2004 028 934

(51) Int. Cl.
*G11C 11/03* (2006.01)
(52) U.S. Cl. ............................. 365/185.25; 365/185.18; 365/185.23; 365/185.27
(58) Field of Classification Search ............ 365/185.25, 365/185.23, 185.27, 185.18
See application file for complete search history.

(56) References Cited

U.S. PATENT DOCUMENTS 5,774,406 A  6/1998  Kowshik
5,914,901 A  * 6/1999  Pascucci ..................... 365/191
6,424,585 B1 * 7/2002  Ooishi ........................ 365/226
6,785,177 B2 * 8/2004  Choy et al. .................. 365/203

OTHER PUBLICATIONS

Sze, S.M., "Semiconductor Devices, Physics and Technology", 2$^{nd}$ Ed., Wiley, 2002, pp. 216-218, (3 pages).

* cited by examiner

*Primary Examiner*—Richard T. Elms
*Assistant Examiner*—Pho M. Luu
(74) *Attorney, Agent, or Firm*—Maginot, Moore & Beck (57) ABSTRACT

A circuit arrangement for the defined discharge of a capacitive load includes a first connecting terminal for connection of the load, a second connecting terminal for application of a predetermined potential, and a third connecting terminal for application of a discharge signal. The circuit arrangement further includes a first switching element, having a load path and a control connection, the load path of which is connected between the first and second connecting terminals and a second switching element, having a load path and a control connection, the load path of which is connected between the first connecting terminal and a terminal for reference potential. The first switching element is driven in a manner dependent on a switching state of the second switching element. The second switching element is driven by a drive circuit to which the discharge signal is fed and which includes a comparator arrangement.

20 Claims, 8 Drawing Sheets

DISCHARGE CIRCUIT FOR A CAPACITIVE LOAD

BACKGROUND

The present invention relates to a discharge circuit for a capacitive load, in particular for a programming and read line in an EEPROM memory.

EEPROM memories contain, in a sufficiently known manner, a number of memory cells which in each case have, as memory element, a MOSFET component with an additional gate electrode arranged in floating fashion. Memory cells of this type are described for example in Sze: "Semiconductor Devices, Physics and Technology", 2nd Edition, Wiley, 2002, pages 216-218. During the programming operation, the gate connections of the memory MOSFETs are put at a high potential, for example a potential of between 15 V and 20 V, it being possible for the gate connections of a plurality of cells to be connected to a common line. The individual cells are then programmed in a manner dependent on whether a high potential is present at the source connections of the individual cells, so that no programming is effected, or a low potential is present, so that programming is effected.

After the programming operation, the programming line has to be discharged from the high potential to a low potential, for example to a potential which is applied to the gate connections for the read-out of the individual cells and which usually lies in the range of between 2 V and 5 V. The discharge of the programming and read line, which constitutes a capacitive load, is intended to be effected as rapidly as possible, on the one hand, and, on the other hand, it is necessary to limit the maximum discharge current in order to prevent destruction of the circuit. Furthermore, it should be ensured that a potential source that prescribes the potential for the read operation is loaded as little as possible by the discharge of the programming and read line.

Furthermore, there are EEPROM memories in which the memory content is erased by application of a large positive voltage and which are programmed by application of a negative voltage. In these memories, too, there is the problem of discharging a line acting as a capacitive load, in the present case the "erase and read line" of the memory, from a high potential still present after the erasure to a low potential.

SUMMARY

It is an aim of the present invention to provide a circuit arrangement for discharging a capacitive load, in particular for discharging the programming line or erase line of an EEPROM memory after the conclusion of the programming operation, which enables a rapid and reliable discharge of the capacitive load from an upper potential value to a predetermined lower potential value and by which a potential source that provides the lower potential value is loaded only to a small extent.

The circuit arrangement according to the invention for the defined discharge of a capacitive load comprises the following features:

a first connecting terminal for connection of the load and a second connecting terminal for application of a predetermined potential, a third connecting terminal for application of a discharge signal, a first switching element, having a load path and a control connection, the load path of which is connected between the first and second connecting terminals and a second switching element, having a load path and a control connection, the load path of which is connected between the first connecting terminal and a terminal for reference potential, the first switching element being driven in a manner dependent on a switching state of the second switching element, a drive circuit for the second switching element, to which the discharge signal is fed and which comprises a comparator arrangement, the comparator arrangement comprising a voltage-controlled third switching element having a load path and a control connection, the load path of which is connected between one of the first and second connecting terminals and the control connection of the second switching element, and a bias voltage source connected between the other of the first and second connecting terminals and the control connection of the third switching element.

In the case of this circuit arrangement, the capacitive load is discharged in accordance with the discharge signal from a first potential to a second potential present at the second connecting terminal. The discharge is effected via the second switching element, which is driven by the drive circuit, to reference potential. The drive circuit compares the potentials at the first and second connecting terminals in order to turn off the second switching element and to stop the discharge if the potential at the first connecting terminal has fallen to the value of the second potential present at the second connecting terminal. If the second switching element turns off in this circuit, the first switching element is turned on in order that the first and second connecting terminals are electrically conductively connected to one another. In the circuit, the driving of the second switching element is effected in a manner dependent on a comparison of the potentials at the first and second connecting terminals via the third switching element, which is driven in a manner dependent on a difference between the potentials at the first and second connecting terminals and a bias voltage supplied by the bias voltage source.

The voltage supplied by the bias voltage source is chosen such that the third switching element starts to turn on when a voltage difference between the potentials at the first and second connecting terminals is less than a predetermined minimum and ideally zero.

The third switching element is for example a transistor component and the bias voltage source is for example a diode element connected between the other of the first and second connecting terminals and the control connection of the transistor component.

In one embodiment, the bias voltage source comprises a first transistor component, the load path of which is connected between the other of the first and second connecting terminals, a second transistor component, the load path of which is connected between the control connection of the first transistor component and a first load connection of the first transistor component and which is driven by a drive signal of the first switching element, and a third transistor component, the load path of which is connected between the control connection of the first transistor component and a second load connection of the first transistor component and which is driven by a drive signal of the second switching element. In this embodiment, the first transistor component fulfills the function of a switched diode.

As load for the first switching element, preferably a current source arrangement is connected in series with the load path of the second switching element and is connected to reference potential, the control connection of the first switching element being connected to a node common to the load path of the second switching element and the current source arrangement.

Moreover, preferably a second current source arrangement is connected in series with the diode element and is connected to reference potential and a third current source arrangement is connected in series with the load path of the third switching element and is connected to reference potential.

In order to rapidly inhibit the first switching element when the potentials at the first and second connecting terminals are identical, a further switching element is preferably present, which is driven by a drive signal of the first switching element and the load path of which is connected in series with the third switching element, it being possible to tap off the drive signal for the second switching element at a node common to the load paths of the third switching element and of the further switching element. This further switching element is part of a control loop connected up with positive feedback and ensures that the second switching element is rapidly inhibited if the comparator arrangement determines that the potentials at the first and second connecting terminals are identical.

BRIEF DESCRIPTION OF THE DRAWINGS

The present invention is explained in more detail below using exemplary embodiments with reference to figures.

In the figures, unless specified otherwise, identical reference symbols designate identical circuit elements and signals with the same meaning.

DESCRIPTION

Figure 1:
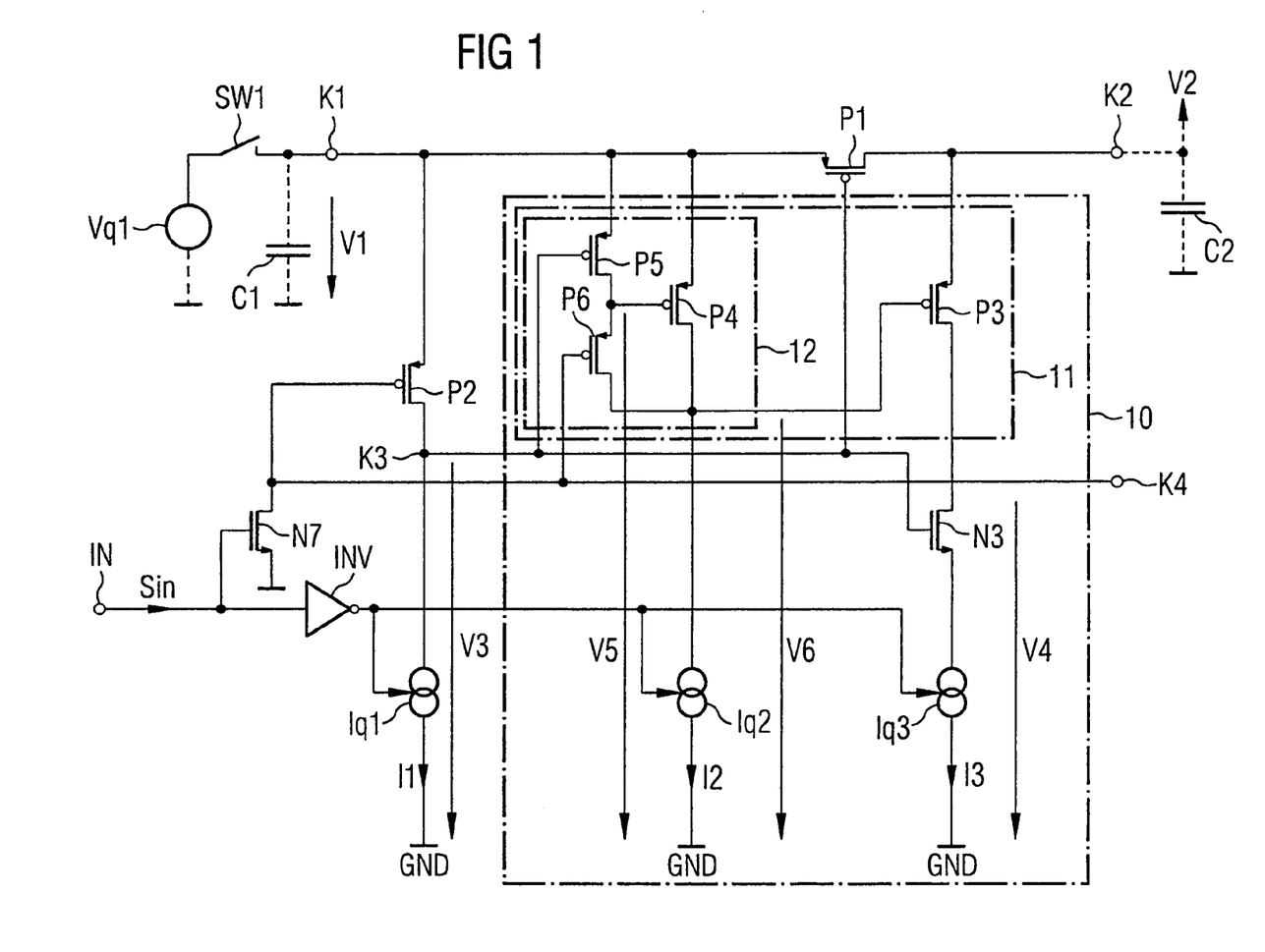
FIG. 1 shows a first exemplary embodiment of a circuit arrangement according to the invention for the defined discharge of a capacitive load.

FIG. 1 shows a first exemplary embodiment of a circuit arrangement according to the invention for the defined discharge of a capacitive load from a first potential, upper potential V1 in the example, to a predetermined second potential, lower potential V2 in the example. In the exemplary embodiment, the load is represented as a capacitor C1 that can be connected to a voltage source Vq1 via a switch SW1. The discharge circuit has the task of discharging this capacitive load C1 in accordance with a discharge signal Sin if it is isolated from the voltage supply.

The discharge circuit comprises a first connecting terminal K1 for connection to the capacitive load C1 and also a second connecting terminal K2 for application of the predetermined lower potential V2, which is less than the maximum value of the upper potential V1 present at the capacitive load C1.

The circuit arrangement furthermore comprises a first switching element P1, which is designed in the example as a transistor component, in concrete terms as a p-conducting MOSFET, and the load path or drain-source path of which is connected between the first and second connecting terminals K1, K2, and which is driven in a manner dependent on a switching state of a second switching element P2. Said second switching element P2 is likewise designed as a p-conducting MOSFET in the example. This second transistor P2 serves for discharging the capacitive load connected to the first connecting terminal K1 with respect to reference potential GND. For this purpose, a load path of said transistor P2 is connected between the first connecting terminal K1 and a reference potential GND. For the defined discharge of the load C1, a controlled first current source arrangement Iq1 is connected in series with the load path of the second MOSFET P2 between the first connecting terminal K1 and reference potential GND, which discharges the load with a first discharge current I1 in the switched-on state and with the second transistor P2 turned on.

The discharge of the capacitive load C1 is effected in accordance with a discharge signal Sin present at a third connecting terminal IN, which discharge signal has a low level in the example if the capacitive load C1 is to be discharged. The discharge signal Sin corresponds for example to the signal which drives the switch SW1 in order to connect the capacitive load C1 to the voltage supply Vq1. This ensures that a discharge of the capacitive load C1 is effected only when the capacitive load C1 is isolated from the voltage supply source Vq1 assigned to it. Depending on the concrete configuration of the capacitive load C1 and the interconnection thereof, the discharge signal Sin may also correspond to a signal which drives a charge pump which serves for providing the voltage present across the capacitive load C1. In this case, a discharge of the capacitive load is to be effected only when the charge pump is switched off. The discharge signal Sin drives the first current source arrangement Iq1 in such a way that the current source arrangement provides the first discharge current when the discharge signal Sin is at a low level. For this purpose, the first current source arrangement is driven by the discharge signal Sin via an inverter INV.

For driving the second switching element P2, the circuit arrangement comprises a drive circuit 10, which provides a drive signal V4 for the second switching element P2 at a further connection K4, which is designated hereinafter as drive signal connection. This drive signal connection is on the one hand connected to the drive connection of the second switching element P2 and on the other hand routed out from the circuit in order to provide externally a signal indicating the switching state of the second switching element P2.

The drive circuit 10 comprises a comparator arrangement 11, which is designed to compare the instantaneous values of the potentials V1, V2 at the first and second connecting terminals K1, K2 with one another in order to generate the drive signal V4 for the second switching element P2 in a manner dependent on this comparison result. Said comparator arrangement comprises a third switching element P3, which is likewise designed as a p-conducting MOSFET, and a bias voltage source 12.

In this case, the load path of the third switching element P3 is connected between the second connecting terminal K2, which is at the second potential V2, and the drive signal terminal K4 or the drive connection of the second switching element P2. The bias voltage source 12 is connected between the first connecting terminal K1, which is at the first potential V1, and the drive connection of the third switching element P3, the third switching element P3 designed as a transistor being a voltage-controlled switching element.

The bias voltage source 12 comprises a fourth transistor P4, which is likewise designed as a p-conducting MOSFET.

Connected between the gate connection of said fourth transistor P4 and the load connection—connected to the first connecting terminal K1—of said fourth transistor P4 is the load path of a fifth transistor P5, which is likewise designed as a p-conducting MOSFET in the example and the drive connection of which is connected to a circuit node K3. Connected between the gate connection of the fourth transistor P4 and the further load connection thereof is the load path of a sixth transistor P6, which is likewise designed as a p-conducting transistor and the drive connection of which is connected to the drive signal terminal K4.

The fourth transistor P4 of the bias voltage source 12, the source connection of which is connected to the first connecting terminal K1, functions as a MOS diode when the sixth transistor P6 is driven in the on state, as a result of which, in this switching state, the potential at the gate connection of the third transistor P3 lies below the voltage at the first connecting terminal K1 by the forward voltage of such a MOS diode. It should be pointed out that the forward voltage of such a MOS diode corresponds to the threshold voltage of the p-conducting MOSFETs used in the circuit.

The drive circuit 10 furthermore comprises a second current source arrangement Iq2, which is connected between the node common to the bias voltage source 12 and the drive connection of the third transistor P3 and reference potential GND. In a manner corresponding to the first current source arrangement Iq1, said second current source arrangement Iq2 comprises a switched current source which carries a second current I2 with respect to reference potential GND when the discharge signal Sin is at a low level. Said second current source arrangement Iq2 is preferably configured such that the second current I2 is only a fraction of the first current I1 of the first current source arrangement Iq1. The ratio I2:I1 is 1:10, by way of example. Said second current source arrangement Iq2 serves as a load for the bias voltage source 12, and thus for setting the potential at the drive connection of the third transistor P3.

In the drive circuit 10, there is connected in series with the load path of the third transistor P3 the load path of a further transistor N3, which is realized in the example as an n-conducting MOSFET and thus as a complementary transistor with respect to the transistor P3. Connected between the load path of this further transistor N3 and reference potential GND is a third current source arrangement Iq3, which is realized as a switched current source which supplies a third current I3 with respect to reference potential GND when the discharge signal Sin is at a low level. The drive connection of said further transistor N3 is connected to the circuit node K3. The third current I3 supplied by said third current source arrangement Iq3 in the switched-on state preferably corresponds to the current supplied by the second current source arrangement Iq2.

The circuit node K3 is formed by the drive connection of the first switching element P1, and of the fifth transistor P5, the drive connection of the further transistor N3 and the node common to the second switching element P2 and the first current source.

Figure 2:
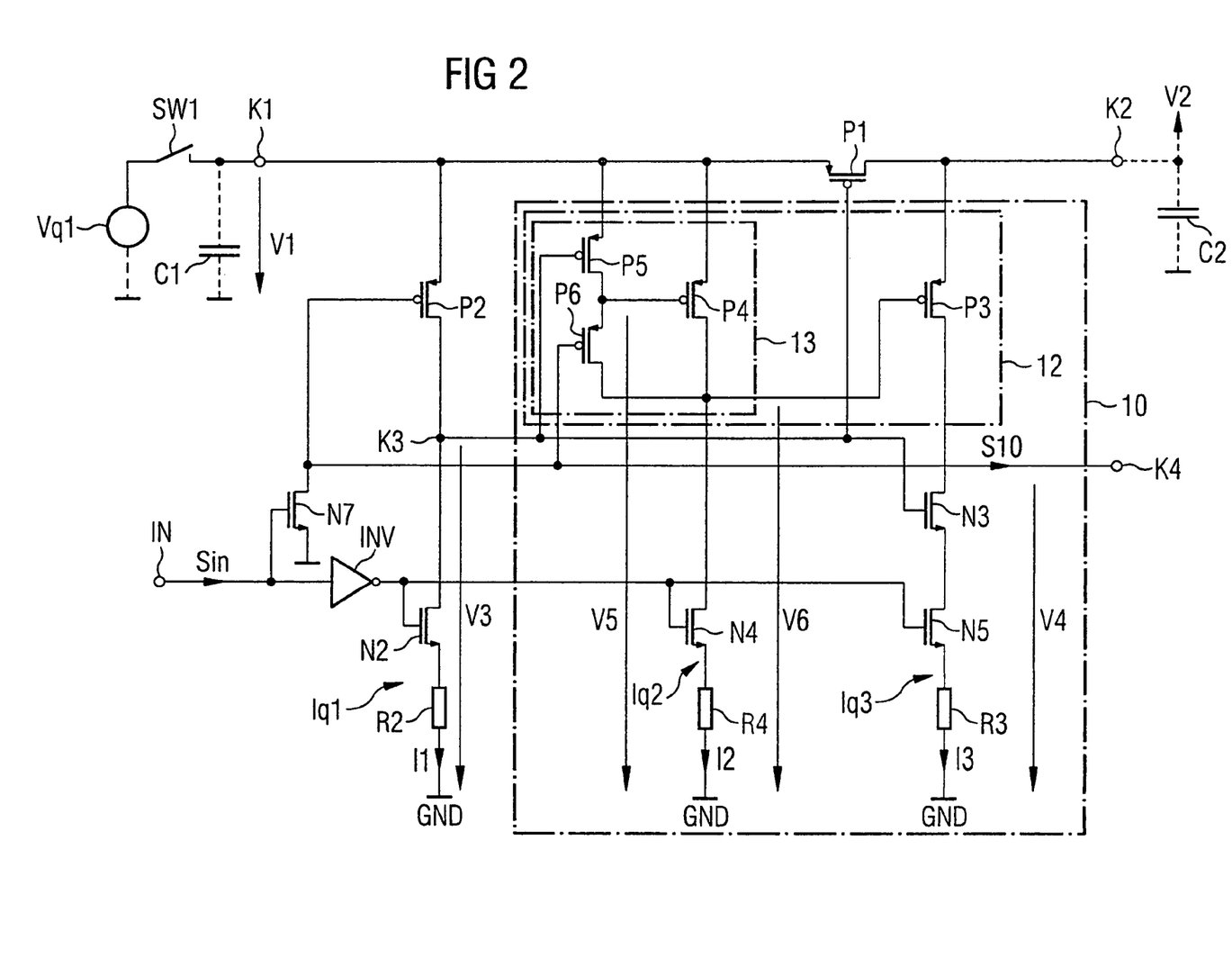
FIG. 2 shows a second exemplary embodiment of a circuit arrangement according to the invention.

In the case of the exemplary embodiment illustrated in FIG. 2, the current source arrangements Iq1-Iq3 are respectively realized by series circuits of n-conducting MOSFETs N2, N4, N5 with resistors R2, R4, R3. The discharge signal Sin inverted by the inverter INV is fed to the drive connections of said MOSFETs N2, N4, N5. These transistors N2 N4, N5 serving as current sources turn on if the discharge signal Sin assumes a low level and the drive signal of said transistors thus assumes a high level. The currents I1-I3 supplied by the current source arrangements Iq1-Iq3 are essentially determined by the resistors R2, R4, R3 connected in series with the load paths of the transistors N2, N4, N5.

The circuit illustrated in FIG. 2 is realized for example as an integrated circuit in a semiconductor chip. In this case, the nonreactive resistors R2, R4, R3 may be realized for example as polysilicon resistors.

The functioning of the circuits illustrated in FIGS. 1 and 2 is explained below for a discharge operation with reference to FIGS. 3 and 4. During this discharge operation, the capacitive load C1 or the potential at the first connecting terminal K1 is discharged from an initial value of the first potential V1 to the value of the second potential V2 corresponding to the potential at the second connecting terminal K2.

Figure 3:
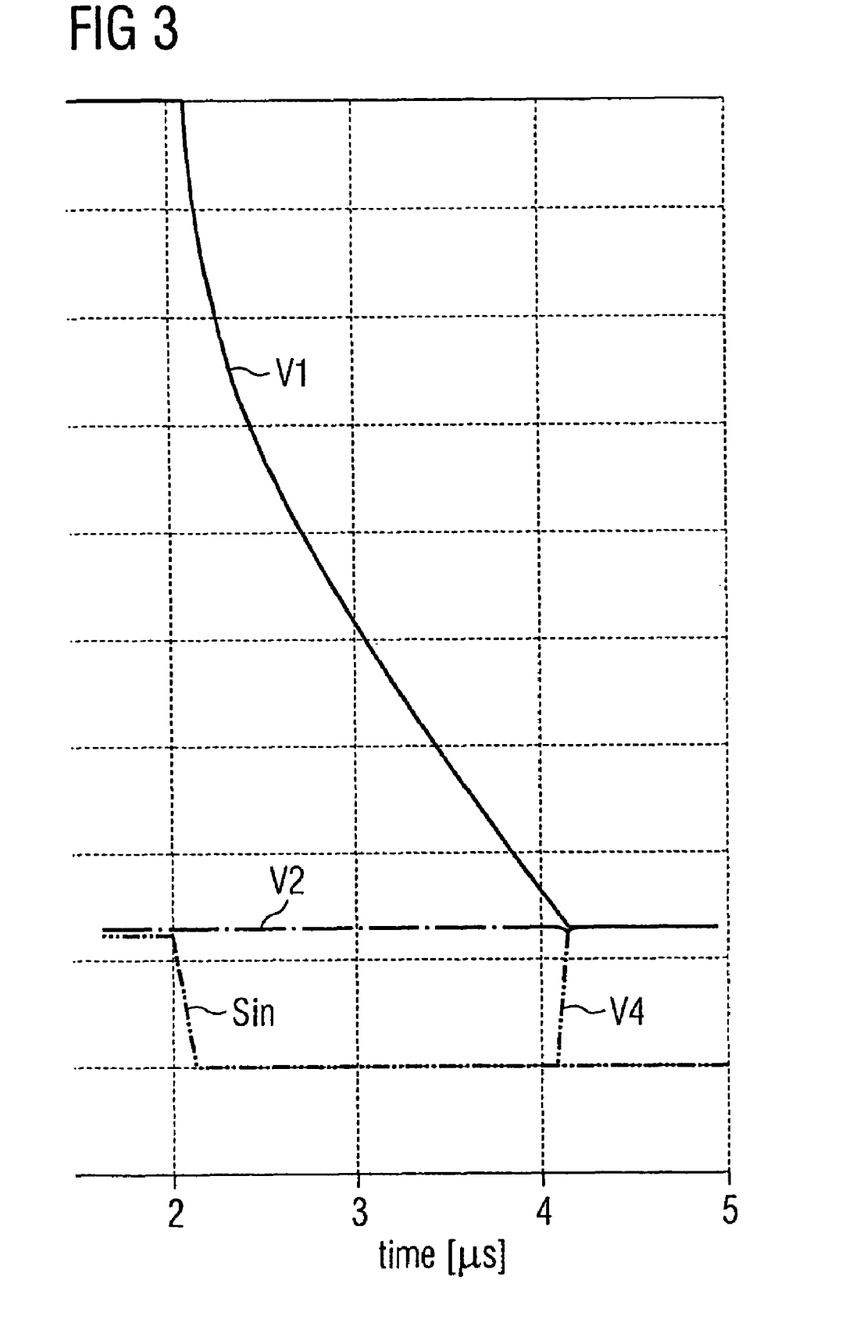
FIG. 3 shows temporal profiles of selected signals of the circuit illustrated in FIG. 2 during a temporal segment of the discharge operation.

FIG. 3 shows the temporal profile of the potential V1 at the first connecting terminal K1, of the potential V2 at the second connecting terminal K2, of the discharge signal Sin and of the potential V4 of the drive signal S10 for the second transistor P2 during this discharge operation. This discharge operation begins if the discharge signal Sin assumes a low level. The discharge operation has ended if the potential at the first connecting terminal K1 has fallen to the value of the potential V2 at the second connecting terminal K2, the drive signal V4 assuming a high level at this point in time in order to turn off the second transistor P2, and thereby to prevent a further discharge of the capacitive load C1 connected to the first connecting terminal K1. At this point in time, the first transistor P1 is driven in the on state in order that the two connecting terminals K1, K2 are electrically conductively connected to one another.

Figure 4:
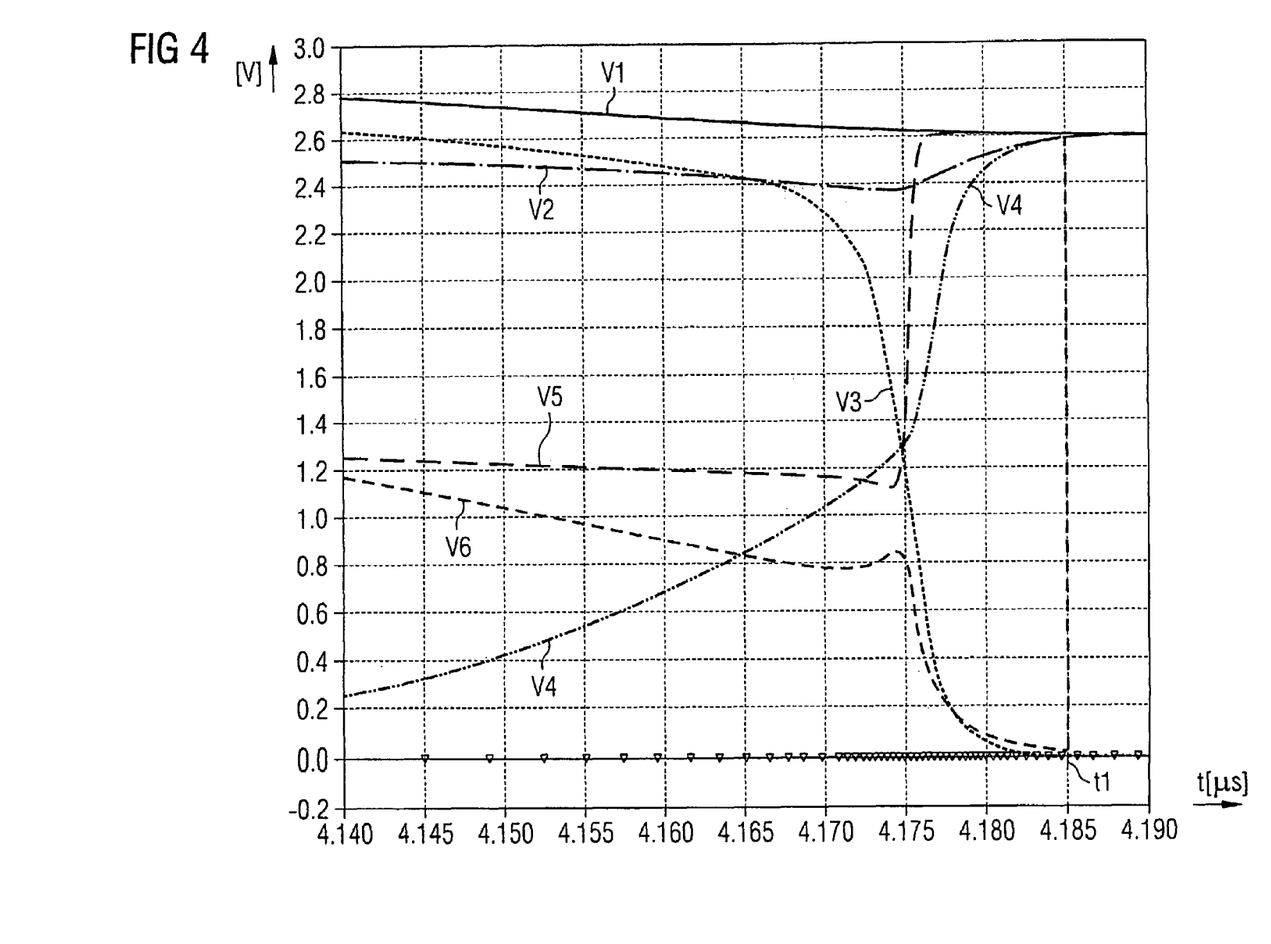
FIG. 4 shows temporal profiles of selected signals of the circuits illustrated in FIG. 2 shortly before and shortly after the end of the discharge operation.

FIG. 4 shows the temporal profile of the first and second potentials V1, V2 and the temporal profile of further signals that are still to be explained in each case shortly before and shortly after the end of the discharge operation.

Before the beginning of the discharge operation, the discharge signal Sin has a high level. The current source arrangements Iq1, Iq2, Iq3 are thereby switched off, or the n-conducting transistors N2, N4, N5 turn off, so that neither a current from the first connecting terminal K1 nor a current from the second connecting terminal K2 can flow to reference potential GND. A further transistor N7, which is an n-conducting transistor in the example, the load path of which is connected between the control connection of the second transistor P2 and reference potential GND and which is driven by the discharge signal Sin, ensures during this operating state that the drive signal V4 of the second transistor P2 assumes a low level in order to drive said transistor P2 in the on state. Owing to the switched-off current source arrangement Iq1, however, the capacitive load C1 cannot be discharged during this operating state. Owing to the turned-on second transistor P2, the potential V3 at the circuit node K3, which drives the first and fifth transistors P1, P5, is approximately at the potential V1 of the first connecting terminal K1, as a result of which the first transistor P1 and the fifth transistor P5 turn off. With the n-channel transistor N7 turned on, the drive connection of the sixth transistor P6 is at a low potential, as a result of which said sixth transistor P6 turns on and the fourth transistor P4 is operated as a MOS diode.

If the discharge signal Sin changes from a high level to a low level in order to begin the discharge operation, then the second transistor P2 initially remains in the on state, but the potential V3 at the node K3 common to said second transistor P2 and the first current source arrangement Iq1 falls by a value corresponding to the product of the on resistance of the second transistor P2 and the discharge current I1. The n-channel transistor N3 connected in series with the third transistor P3 turns on in a manner driven by said potential V3, as a result of which the drive signal V4 at the drive signal terminal K4 initially remains at a low level in order to keep the second transistor P2 in the on state. At the same time, the sixth transistor P6 remains in the on state in order to operate the fourth transistor P4 as a MOS diode, and the fifth transistor P3, the drive connection of which is at the potential value V3 of the circuit node K3, turns off. A drive potential V6 of the third transistor P3 corresponds to the first potential V1 minus the forward voltage of the fourth transistor P4 operated as a MOS diode. As long as said potential V6 is greater than the value of the second potential V2 minus the threshold voltage of the third transistor P3, the third transistor P3 turns off, and thereby supports the low potential of the drive signal V4 at the drive terminal K4.

If, as a result of the discharge via the second transistor P2 and the first current source arrangement Iq1, the first potential V1 falls to a value that approximately corresponds to the second potential V2 at the second connecting terminal K2, then the drive potential V6 lies below the value of the second supply potential V2 by the value of the forward voltage of the MOS diode P4, and thereby by the value of the threshold voltage of the p-channel transistors. As a result of this, the third transistor P3 begins to turn on, as a result of which the drive potential V4 begins to rise in the direction of the second potential V2. The second transistor P2 is thereby inhibited, as a result of which the potential V3 at the circuit node K3 decreases. As a result of this, the transistor N3 connected in series with the third transistor P3 is inhibited, which accelerates the rise in the potential V4 at the drive signal terminal K4 and, as a result, a further inhibiting of the second transistor P2.

The transistor N3, which concomitantly determines the drive potential V4 of the second transistor P2, and the second transistor P2 form a positive feedback circuit, that is to say that a rise in the drive potential V4 causes increasing inhibiting of the second transistor P2, as a result of which the potential V3 at the circuit node K3 decreases further, and as a result of which the further transistor N3 is inhibited further in order to increase the drive potential V4 further.

With an increasing rise in the drive potential V4, the sixth transistor P6 of the bias voltage source 13 is inhibited, and with the simultaneously decreasing potential V3 of the circuit node K3, the fifth transistor P5 of the bias voltage source 13 is increasingly turned on, which has the overall effect that the fourth transistor P4 is increasingly inhibited. This has the effect that the drive potential V6 of the third transistor P3 decreases, as a result of which the third transistor P3 is increasingly turned on and supports a rise in the potential V4 at the drive node K4. In this case, the third transistor P3 is likewise part of the positive feedback circuit explained above since, with an increasing rise in the drive potential V4 and associated decrease in the potential V3, the fourth transistor P4 is inhibited, as a result of which the drive potential V6 of the third transistor P3 decreases, and the third transistor P3 increasingly turns on in order to support the rise in the drive potential V4.

The temporal profile of the first and second potentials V1, V2, of the potential V3 of the circuit node N3, of the drive potential V4 of the second transistor P2, of the drive potential V6 of the third transistor P3 and also the drive potential V5 of the fourth transistor P4 during the operation explained above is illustrated in FIG. 4.

In this case, the discharge operation has concluded at an instant t1, at which the drive signal V4 has risen approximately to the value of the second potential V2, since the third transistor P3 turns on completely. Owing to the drive potential V3 of the first transistor P1 that has fallen approximately to zero at this instant, the first transistor P1 turns on in order to short-circuit the two connecting terminals K1, K2. The drive potential V6 of the third transistor P3 is at reference potential GND after the conclusion of the discharge operation if the second current source arrangement Iq2 still supplies a discharge current I2. The drive potential V5 of the fourth transistor P4 is at the first potential V1 owing to the turned-on fifth transistor P5, said first potential then corresponding to the second potential V2.

Referring to FIG. 4, the first potential V1 matches the second potential at the second connection only when the discharge operation is concluded at the instant t1 if the first transistor P1 is in the on state. Up to this point in time there is a difference between the first and second potentials V1, V2, the second potential V2 initially decreasing somewhat with respect to the final value toward the end of the discharge operation owing to the turned-on transistor P3 and subsequently rising toward the value of the first potential owing to the first transistor P1 that is increasingly driven in the on state. This difference between the first and second potentials V1, V2 can be minimized through suitable dimensioning of the transistors for a specific value of the load capacitance at V1. Other load capacitances, and other temporal changes dV1/dt of the first potential V1 that result therefrom, lead to other potential differences V1-V2 shortly before the discharge operation is concluded.

The transistors of the circuit are preferably dimensioned such that the potential V2 at the terminal K2 is not permitted to be substantially increased as a result of the turn-on of the first transistor P1 and thus the short-circuiting of the first and second terminals K1, K2. Thus, the discharge operation is not permitted to be ended too early and the transistor P1 is not permitted to be driven in the on state too early.

Figure 5:
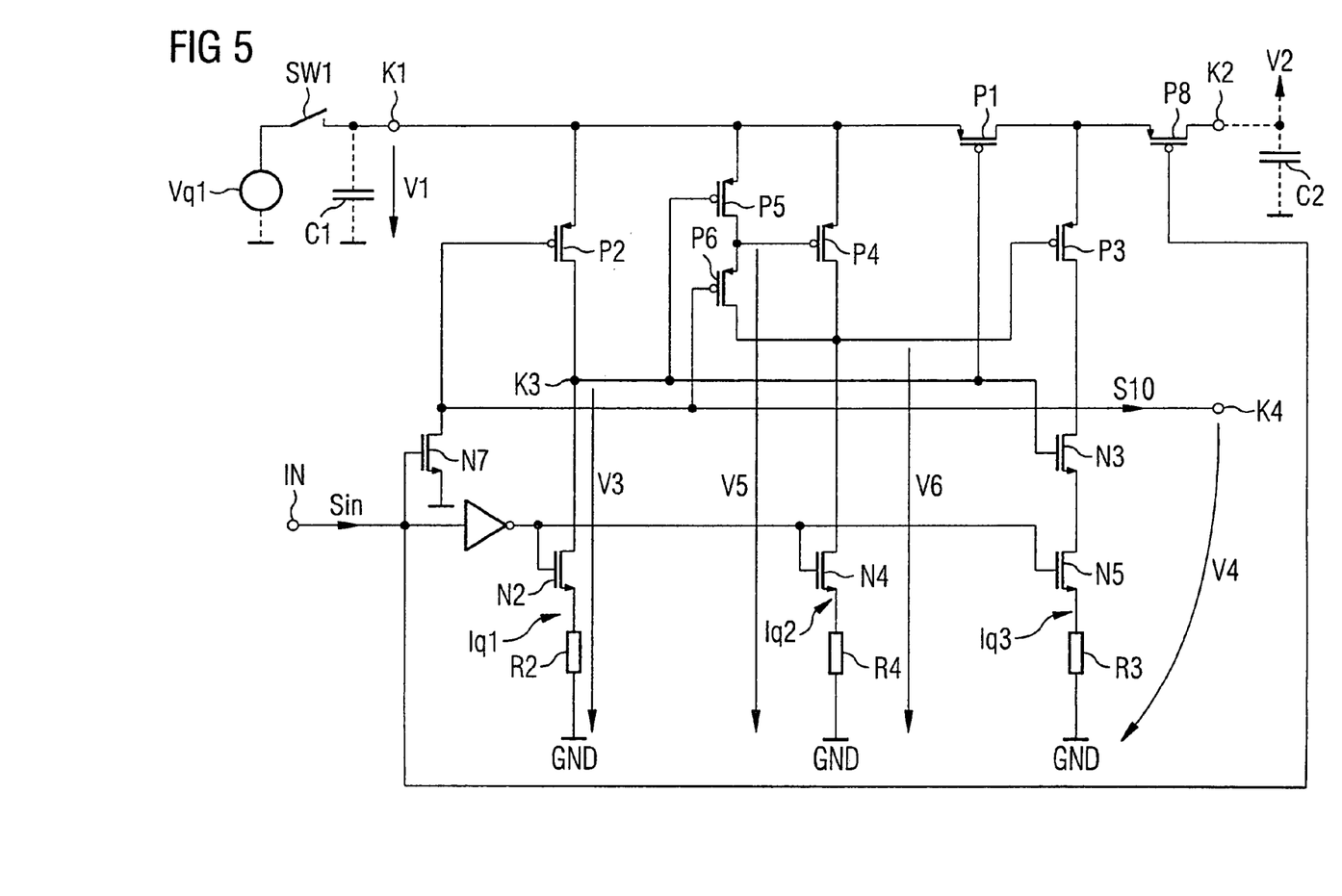
FIG. 5 shows a third exemplary embodiment of a circuit arrangement according to the invention.

FIG. 5 shows a modification of the circuit illustrated in FIG. 2, in the case of which the load path of a further switching element P8, designed as a p-conducting transistor, is connected between the load path of the first switching element P1 and the second connecting terminal K2. This p-conducting transistor P8 is driven by the discharge signal Sin, the transistor being driven in the on state when the discharge signal Sin is at a low level, that is to say during a time duration during which the potential at the first connecting terminal K1 is to correspond to the potential at the second connecting terminal K2. The additional transistor P8 is required in particular if the potential V1 at the first terminal K1 is intended to fall to a value that is lower than the potential V2 at the second terminal K2 by more than a diode forward voltage. This may be required in particular for test and evaluation purposes. In order to achieve such a decrease in the first potential by means of the discharge circuit, the bulk connection of the first transistor P1 is preferably at the potential V1 at the first terminal K1, and the bulk connection of the further transistor P8 is preferably at the potential V2 at the second terminal K2.

Figure 6:
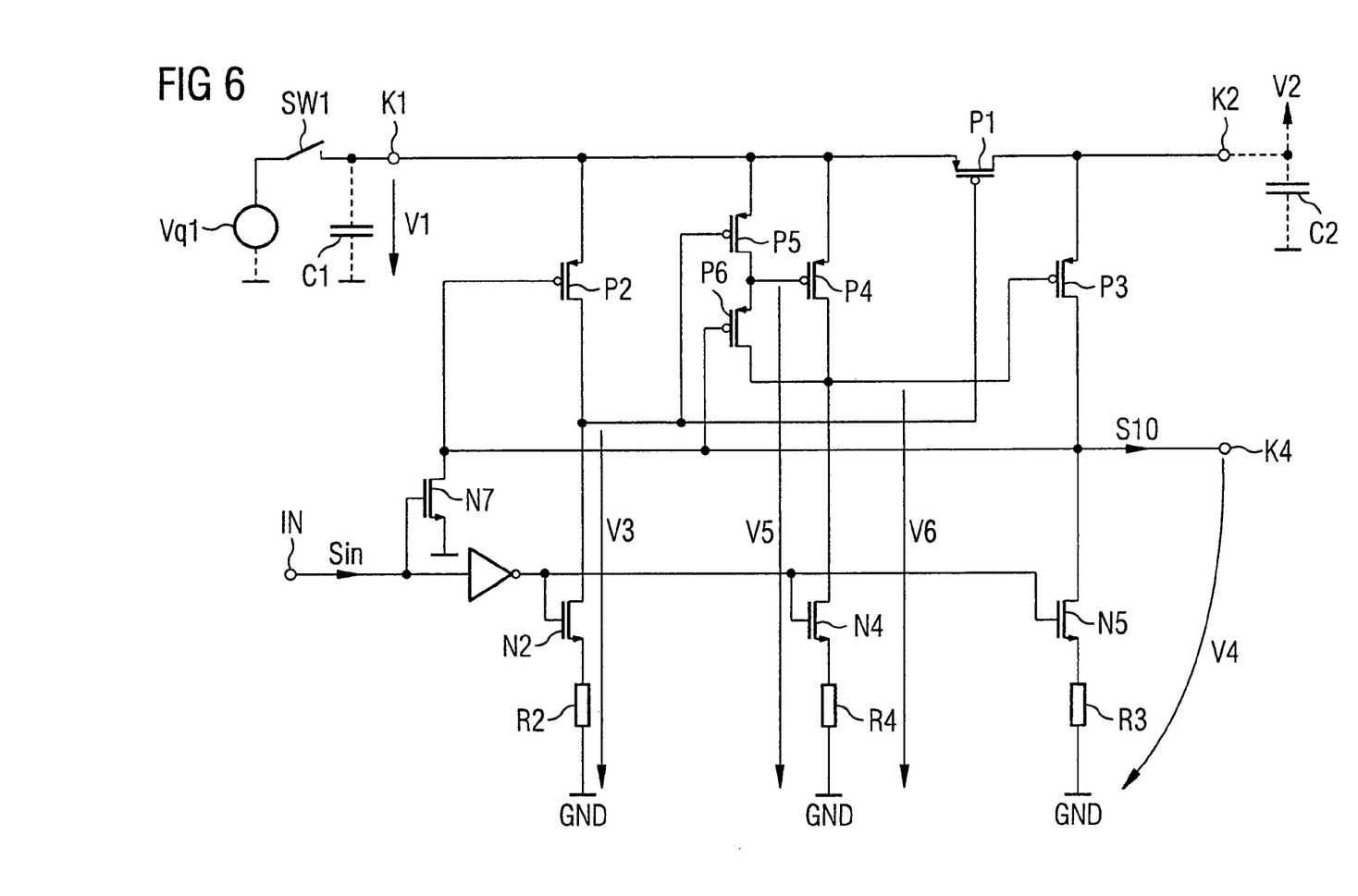
FIG. 6 shows a fourth exemplary embodiment of a circuit arrangement according to the invention.

FIG. 6 shows a further modification of the circuit arrangement illustrated in FIG. 2, the transistor connected in series with the third switching element P3 being dispensed with in the case of the circuit arrangement in accordance with FIG. 6. In this exemplary embodiment, the potential at the drive signal terminal K4 is set exclusively by means of the third current source arrangement Iq3 and the third transistor P3.

Figure 7:
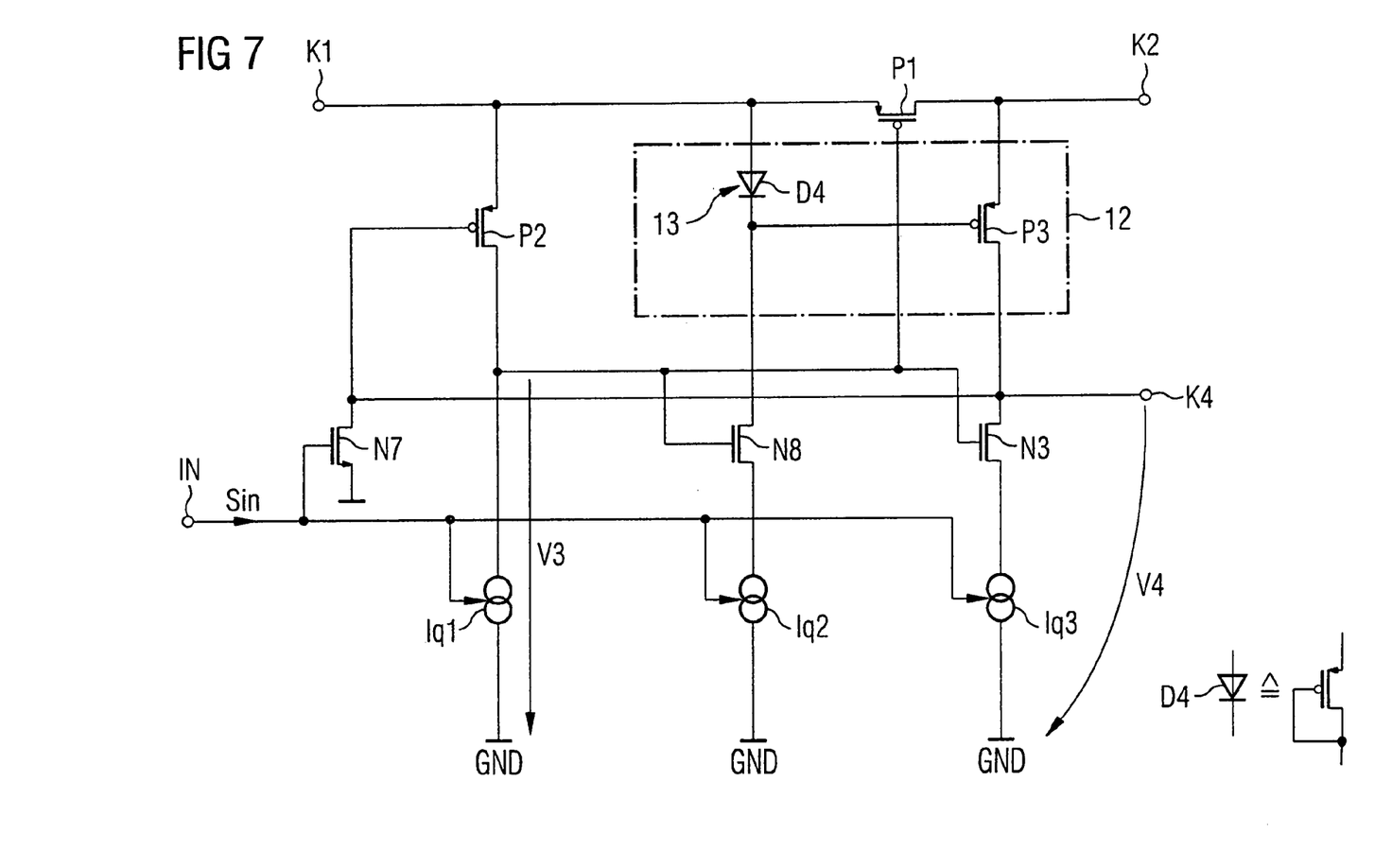
FIG. 7 shows a fifth exemplary embodiment of a circuit arrangement according to the invention.

In a further modification of the circuit arrangement as illustrated in FIG. 7, the bias voltage source 13 connected between the first connecting terminal K1 and the drive connection of the third transistor P3 merely comprises a diode D4, which is preferably realized as a MOS diode. In this case, a further n-conducting transistor N8 is connected between the node common to said diode D4 and the drive connection of the third transistor P3 and the second current source arrangement Iq2, said further n-conducting transistor being driven by the drive potential V3 of the first transistor P1 and thus complementarily with respect to said first transistor P1. Said further transistor N8 is in the on state until the discharge operation is concluded.

The discharge circuit according to the invention is suitable in particular for use in an EEPROM memory.

Figure 8:
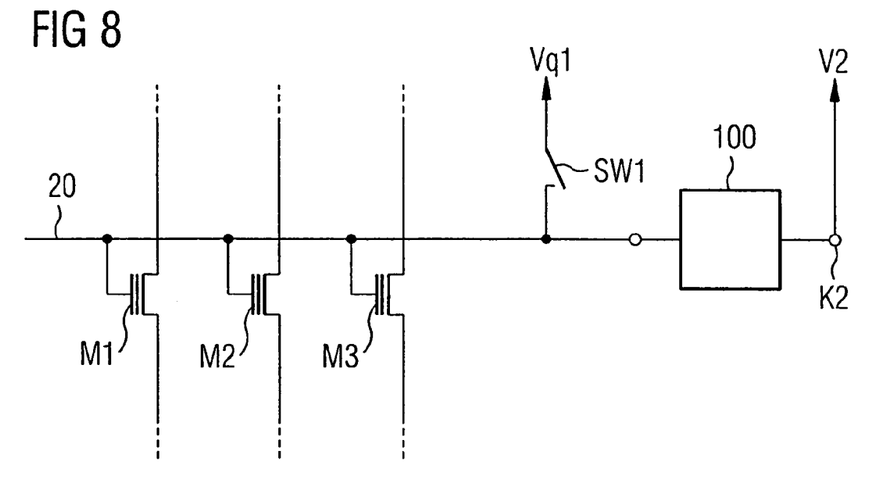
FIG. 8 illustrates one possible use of a circuit arrangement according to the invention for the discharge of a programming/read line of an EEPROM memory.

FIG. 8 schematically shows three memory cells M1, M2, M3 of such an EEPROM memory, the gate connections of which are connected to a programming/read line 20. Said programming/read line 20 constitutes a capacitive load which, for programming the memory cells, can be connected via a switch SW1 to a voltage source for programming potential, for example a charge pump. The first connecting terminal K1 of the discharge circuit according to the invention, said discharge circuit being illustrated as circuit block 100 in FIG. 8, is connected to said programming/read line in order to discharge the line 20 after the conclusion of the programming operation, i.e. after the opening of the switch SW1, and to connect it to a voltage source for lower potential, for example a potential suitable for the read-out of the memory cells.

LIST OF REFERENCE SYMBOLS

C1 capacitive load
C2 capacitive load
D4 Diode
IN input terminal
INV Inverter
Iq1-Iq3 Current source arrangements
K1 First connecting terminal
K2 Second connecting terminal
K3 Circuit node
K4 Drive signal terminal
M1-M3 EEPROM memory cells
N2-N5 n-channel MOSFET
N7 n-channel MOSFET
P1-P6 p-channel MOSFET
P8 p-channel MOSFET
R2, R3, R4 Nonreactive resistors
Sin Discharge signal
SW1 Switch
V1 First potential
V2 Second potential
V3, V4, V5, V6 Drive potentials
Vq1 Voltage source
10 Drive circuit
11 Comparator arrangement
12 Bias voltage source
100 Discharge circuit

The invention claimed is:

1. A circuit arrangement for discharge of a capacitive load, the circuit arrangement comprising:
a first and second switching element each including a load path and a control connection, the load path of the first switching element configured to controllably connect the capacitive load and a predetermined potential, the load path of the second switching element configured to controllably connect the capacitive load and a reference potential, the first switching element being driven in a manner dependent on a switching state of the second switching element;
a drive circuit for the second switching element configured to receive a discharge signal, the drive circuit comprising: a third switching element including a load path and a control connection, the load path of the third switching element configured to controllably connect the predetermined potential and the control connection of the second switching element; and
a bias voltage source for operable connection between the capacitive load and the control connection of the third switching element.

2. The circuit arrangement of claim 1, wherein the third switching element comprises a transistor component; and further wherein the bias voltage source includes a diode element configured to be operably connected between the capacitive load and the control connection of the third switching element.

3. The circuit arrangement of claim 1, wherein the bias voltage source comprises: a first transistor component including a load path, a first and second load connection and a control connection, the load path configured to controllably connect the capacitive load and the control connection of the third switching element; a second transistor component including a load path operably connected between the control connection of the first transistor component and the first load connection of the first transistor component, the second transistor component being driven by a drive signal of the first switching element; and a third transistor component including a load path operably connected between the control connection of the first transistor component and the second load connection of the first transistor component, the third transistor component being driven by a drive signal of the second switching element.

4. The circuit arrangement of claim 3, wherein the first, second and third transistor components of the bias voltage source are of the same conductivity type.

5. The circuit arrangement of claim 1, further comprising a first current source arrangement for being operably connected in series between the load path of the second switching element and the reference potential; and wherein the control connection of the first switching element is operably connected to the load path of the second switching element and the first current source arrangement.

6. The circuit arrangement of claim 5, wherein the drive circuit includes a second current source arrangement configured to be operably connected in series between a diode element and the reference potential and a third current source arrangement configured to be operably connected in series between the load path of the third switching element and the reference potential.

7. The circuit arrangement of claim 6, wherein currents supplied by the second current source and the third current source have a predetermined ratio in relation a current supplied by the first current source.

8. The circuit arrangement of claim 6, wherein the first, second and third current source arrangements each include a transistor element driven by the discharge signal and a resistive element operably connected in series with the transistor element.

9. The circuit arrangement of claim 5, further comprising a further transistor component including a load path operably connected between the control connection of the second switching element and the reference potential, the further transistor component configured to be driven by the discharge signal.

10. The circuit arrangement of claim 1, wherein the drive circuit further comprises a further switching element configured to be driven by a drive signal of the first switching element, the further switching element including a load path operably connected in series with the third switching element.

11. The circuit arrangement of claim 1, wherein the first, second and third switching elements comprise transistor components of the same conductivity type.

12. The circuit arrangement of claim 1, wherein the circuit arrangement is used in an EEPROM memory for the controlled discharge of at least one of a programming line, a programming/read line, an erase line or an erase/read line.

13. A circuit arrangement for the discharge of a capacitive load, the circuit arrangement comprising:
 a first switching element configured to controllably connect the capacitive load and a predetermined potential,
 a second switching element configured to controllably connect the capacitive load and a reference potential; and
 a drive circuit configured to drive the second switching element;
 wherein the drive circuit drives the second switching element in a manner dependent on a comparison of the capacitive load and the predetermined potential; and
 wherein the first switching element is driven in a manner dependent on a switching state of the second switching element.

14. The circuit arrangement of claim 13, wherein the first and second switching elements each comprise transistor components including a load path and a control connection, the load path of the first switch element being operably connected between the capacitive load and the predetermined potential, the load path of the second switching element being operably connected between the capacitive load and the reference potential.

15. The circuit arrangement of claim 14, wherein the drive circuit comprises a third switching element and a bias voltage source, the third switching element comprising a transistor component including a load path and a control connection, the load path of the third switching element being operably connected between predetermined potential and the control connection of the second switching element, and the bias voltage source being operably connected between the capacitive load and the control connection of the third switching element.

16. The circuit arrangement of claim 15, wherein the bias voltage source comprises a diode element configured to be connected to the capacitive load and the control connection of the third switching element.

17. The circuit arrangement of claim 15, wherein the bias voltage source comprises:
 a first transistor component including a load path, a first and second load connection and a control connection, the load path of the first transistor configured to controllably connect the capacitive load and the control connection of the third switching element;
 a second transistor component including a load path operably connected between the control connection of the first transistor component and the first load connection of the first transistor component, the second transistor component being driven by a drive signal of the first switching element; and
 a third transistor component including a load path operably connected between the control connection of the first transistor component and the second load connection of the first transistor component, the third transistor component being driven by a drive signal of the second switching element.

18. The circuit arrangement of claim 15, wherein the first, second and third switching elements comprise transistor components of the same conductor type.

19. The circuit arrangement of claim 15, further comprising a further transistor component including a load path operably connected between the control connection of the second switching element and the reference potential, the further transistor component configured to be driven by the discharge signal.

20. A method for discharging a capacitive load, the method comprising:
 providing a first and second switching element each including a control connection;
 controllably connecting the capacitive load and a predetermined potential using the first switching element;
 controllably connecting the capacitive load and a reference potential using the second switching element;
 driving the first switching element in a manner dependent on a switching state of the second switching element;
 receiving a discharge signal at a drive circuit for the second switching element, the drive circuit comprising a third switching element including a control connection;
 controllably connecting the predetermined potential and the control connection of the second switching element; and
 connecting a bias voltage source between the capacitive load to the control connection of the third switching element.

* * * * *